Aug. 26, 1958 J. L. BOYER ET AL 2,849,665

ULTRA HIGH POWER TRANSISTOR

Filed Oct. 17, 1955

WITNESSES

Robert C. Baird

Charles F. Renz

INVENTORS
John L. Boyer &
August P. Colaiaco.
BY
F. E. Browder
ATTORNEY

United States Patent Office 2,849,665
Patented Aug. 26, 1958

2,849,665

ULTRA HIGH POWER TRANSISTOR

John L. Boyer, Forest Hills, and August P. Colaiaco, Penn Township, Allegheny County, Pa., assignors to Westinghouse Electric Corporation, East Pittsburgh, Pa., a corporation of Pennsylvania Application October 17, 1955, Serial No. 540,756

7 Claims. (Cl. 317—235)

This invention relates to semiconductor devices and, more particularly, to junction-type transistors suitable for ultra high power applications.

Semiconductor materials, such as germanium or silicon, may be classified in this art as P-type or N-type materials, depending on the type of conductivity. The N-type material is characterized in that an excess of electrons exists within the material and, therefore, the predominant conduction carriers are electrons. The P-type material is characterized in that a deficiency of electrons in the material exists, and the conduction carriers are the so-called holes. The conduction in a P-type material takes place due to the apparent movement of the electron vacancies or holes within the material which act like positive charges.

The determinant as to whether a semiconductor body is of N-type or P-type conductivity is the amount and type of certain impurities added to the pure material. These impurities may be donor impurities, such as antimony, phosphorus or arsenic, falling in group V–A of the periodic table, which add excess electrons to produce an N-type material, or they may be acceptor impurities, such as gallium, aluminum and indium, falling in group III–A of the periodic table, which absorb electrons to produce a P-type material.

If a body of semiconductor material is made having contiguous zones of N-type and P-type material, the junction or transition region which is referred to as a P–N junction formed between these two zones acts as a rectifying barrier or layer. This transition region has a low impedance to current flow from the P-type to N-type material but of a very high impedance to current flow from the N-type to P-type material.

A transistor device is a three terminal semi-conductor device having a body wherein a zone of one conductivity type is sandwiched between two zones of opposite conductivity types to form two P–N junctions. The transistor is utilized to obtain current, voltage and power amplification, or to control power flow. The characteristics and properties of a junction transistor are more fully described in an article entitled "Operation of junction transistors," by A. Coblenz and H. L. Owens in the August 1953 issue of Electronics. Briefly, the low power type transistor that is well known in the art consists of a device in which a semiconductor body in the shape of a wafer is constructed with three layers or zones along the thickness dimension of the wafer with electrode terminals connected such that one of the outer layers is the emitter electrode and the other outer layer is the collector electrode and the intermediate layer is the base electrode.

The devices as described in this application are directed to those power equipments which call for carrying capacity of hundreds of amperes with a dissipation of several hundred watts. This type of equipment will result in higher currents on the crystal of possibly 1,000 times greater than the presently known power transistor devices. It is to this type of equipment that this invention is directed in order to overcome the problems associated with high power.

In the manufacture of large area junction transistors for practical power uses, certain difficulties are encountered. The semiconductor wafer or body for this application must be of the order of 12 mils in thickness with the major dimensions being of the order of 1 inch. The presently used semiconductor materials, such as germanium or silicon, are brittle materials and when cut into wafers of the above dimensions are extremely fragile and easily broken. It is, therefore, necessary to design the transistor devices so that the electrode contacts on the wafer adequately support and protect the wafer from mechanical stress in order to prevent breakage.

It is also necessary to provide for the best possible heat transfer from the semiconductor wafer to prevent excessive temperature rise and possible destruction of the wafer. The semiconductor materials, especially germanium, have quite definite temperature limitations in operation. It is, therefore, desirable to provide large area good thermal contacts for removing heat from the semiconductor material.

From the above discussion, it would indicate that single large area electrode contacts to the semiconductor wafer would be desirable for the high current carrying electrodes, normally the emitter and collector. The base or control electrode, which in normal transistor applications is the biasing electrode, does not carry large currents and, therefore, may usually be of small contact area. It has been found in all the possible structures known that this results in the base electrode being positioned at different distances from the emitter or collector contact area. The result is that the emitter or collector electrode is found to carry substantially the entire current in large current application in that area adjacent to the base electrode due to the resistance of the semiconductor material in the base region providing a variation in bias across the large area emitter or collector electrode. It has, therefore, been found advisable to go to what may be referred to as multiple type connections to provide large area contacts with substantially uniform distances between base, emitter and collector electrodes. This may be accomplished by providing multiple alternate connection of two electrodes to one surface and a continuous connection to the other surfaces for the remaining electrode. This structure provides small current flow paths from the emitter electrode to the base electrode. It has been found desirable that in the case of silicon these flow paths should be of the order of 3 mils.

It is, therefore, an object of this invention to provide an improved power transistor device.

It is another object to provide a power transistor device in which the semiconductor material is supported in such a manner that it is not subjected to appreciable mechanical stresses and so that heat generated in the semiconductor can readily be conducted away.

It is another object to provide a power transistor device in which the semiconductor material and current conducting electrodes have approximately the same coefficient of thermal expansion over a wide range of temperature or else the electrode is flexible so that thermal expansion does not exert any force on the junctions.

It is another object to provide an improved power transistor device to obtain a multiple-type electrode contact to one surface of a semiconductor wafer to provide a high current carrying contact electrode.

These and other objects are effected by our invention as will be apparent from the following description taken in accordance with the accompanying drawing and throughout which like reference characters indicate like parts, and in which.

Figure 1:
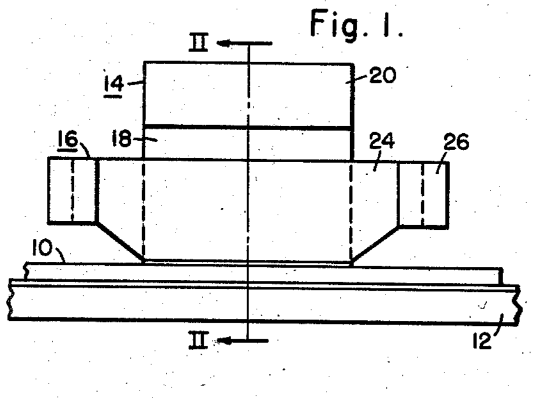
Figure 1 is an elevational view of a semi-conductor junction transistor device embodying our invention.
Figure 2:
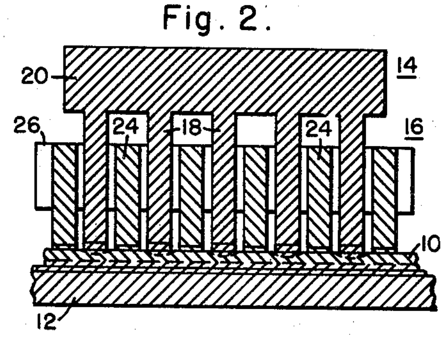
Fig. 2 is a sectional view taken along line II—II of Fig. 1.
Figure 3:
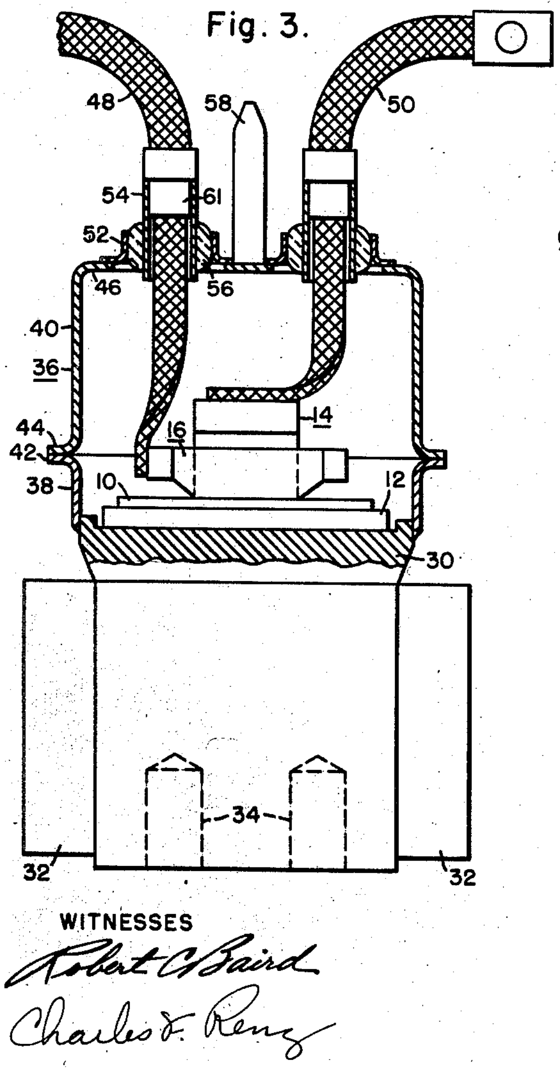
Fig. 3 is a vertical view partly in section of a sealed unit.

Referring in detail to Figs. 1, 2 and 3, there is shown a high power P–N–P junction-type semiconductor device illustrating our invention. The structure consists of a semiconductor crystal wafer 10 of any suitable semiconductor material, such as silicon or germanium, and for this description, the semiconductor material will be limited to germanium with associated suitable impurities. The wafer 10 may be of an N-type germanium having a resistivity of 1 to 5 ohm centimeters, which may be circular in shape having a diameter of the order of 1 inch and a thickness of the order of 12 mils.

The semiconductor device is constructed in the following manner. On the lower surface of the semiconductor wafer is positioned an electrode member 12 in the form of a plate 12 of a suitable material, such as molybdenum or tungsten. The electrode 12 may serve as emitter electrode in this description. The molybdenum plate 12 is prepared prior to placing on the semiconductor wafer by dipping or any other suitable process in a wetting agent, such as indium, in order to insure wetting of the molybdenum material in a later process. The thickness of the molybdenum plate 12 is of the order of 20 to 40 mils. A foil of indium of the order of 3 mils in thickness is placed between the molybdenum plate 12 and the semiconductor wafer 10.

On the opposite or upper surface of the semiconductor wafer 10 are provided two electrode members 14 and 16. The electrode 14 is in the form of a plurality of parallel plates 18 positioned so as to be perpendicular to the surface of the semiconductor wafer 10, with a planar member 20 in contact with the opposite edge of the plates 18. The electrode 16 also consists of a plurality of parallel plates 24 positioned so as to be perpendicular to the surface of said wafer 10. The dimension of the plate 24 perpendicular to the surface of the wafer 10 is less than the dimension of the plates 18 while their dimension parallel to the wafer is greater than the dimension of plates 18. A slotted member 26 is provided at each end of the plates 24 to provide electrical connection and mechanical support of the plates 24. By this construction the two members 14 and 16 may be placed on the upper surface of the wafer 10 with the plates 18 and 24 in alternate relation. The plate contacts 18 and 24 are connected in an alternate relation so as to provide in effect two interleaved plate contact electrodes. The electrode member 16 may be utilized as the base electrode. The electrode member 14 in which its plates 18 are interleaved with the plates 24 provide the collector contact with the semiconductor wafer 10. Since the collector contact 14 is one of the normally large current-carrying electrodes of the device, a large area planar connector 20 is provided above the plates 18 for connecting to a suitable lead-in connector. The plates 18 and 24 making up the collector and base electrodes should also be of molybdenum in the case of germanium, while in the case of silicon, tungsten may also be used. It is also possible to manufacture the collector and base electrodes consisting of the plates and connectors by machining the entire electrode structure out of a solid piece of molybdenum.

The edges of the plates 18 of the collector electrode 14 which contact the semiconductor wafer 10 are also pre-wetted with indium in a similar manner as the emitter contact 12, and then a layer of foil of indium of a thickness of the order of 3 mils is positioned between the edge of the plates 18 and the semiconductor wafer 10. It may be desirable to plate or evaporate this 3 mil thickness of indium onto the edge of the plates 18 rather than use the foil. The edges of the plates 24 of the base electrode 16 in contact with the semiconductor wafer 10 are coated with a suitable low temperature solder, such as tin. In order to provide carrying capacity of hundreds of amperes, the plate members 18 and 24, especially the collector plate members 18, should be of the order of 20 mils in thickness with a spacing of 5 to 10 mils between adjacent plates 18 and 24.

The entire structure, including the semiconductor wafer 10 with the emitter 12, base 16 and collector 14, electrodes positioned thereon, and intermediate solder material is inserted into a furnace and raised to a temperature of approximately 600° C. and then cooled. This heating process causes the indium solder on the collector 14 and emitter 12 contact electrodes to solder the electrodes 12 and 14 to the semiconductor wafer 10, and also the indium material fuses and diffuses into the semiconductor wafer 10 for a distance of the order of 3 mils, as shown by the dotted lines. This diffusion converts the N-type wafer to the P-type, thereby forming a P–N junction between the electrode contacts 12 and 14 and the semiconductor body 10. The base electrode 16 is also soldered and fused to the semiconductor wafer 10 in this heat process and diffuses into the wafer 10 for a short distance but does not convert the N-type material to P-type as does the indium in the case of the emitter and collector electrodes 12 and 14.

The resulting device is what is referred to as a P–N–P type junction transistor, and it is understood, of course, that other materials might be used which would have the same effect, and, if desired, the conductivity types might be reversed to form what is known as an N–P–N type transistor. The resulting structure consists of a fragile flat piece of semiconductor material 10 which is supported on one side by the emitter contact 12 which is a metal plate. This metal plate 12 in this specific case of molybdenum, provides good conduction of heat from the wafer. The thermal expansion of the molybdenum material in the collector, emitter and base electrodes 12, 14 and 16 is close enough to that of the germanium material in the wafer 10 so that when the device is heated, the differential expansion is quite small and the fragile wafer 10 is not subjected to appreciable mechanical stresses. The solder and indium are also relatively ductile materials and have a cushioning effect to further enhance the protection of the wafer 10 from undesirable stresses.

It should also be noted that the emitter and collector electrodes 12 and 14 may be reversed in some applications. The plate structure of the base and collector electrodes 14 and 12 with connectors positioned on the upper surface of the semiconductor wafer 10 provide self-supporting electrode contacts with the semi-conductor to carry the high currents involved. It is also to be noted that the distance between the emitter, collector and the base electrodes is substantially constant over the entire area to insure that the semiconductor wafer carries current across the entire area of wafer at high currents.

In order to further enhance heat removal from the semiconductor device and to provide moisture and impurity protection of the semiconductor wafer, the semiconductor device is sealed within an enclosure. The completed sealed unit is illustrated in Fig. 3 and is comprised of an elongated copper solid support cylinder 30 with radial fins 32 about the periphery of the copper block 30 and the molybdenum plate 12 of the semiconductor device brazed to the upper end surface of the cylindrical block 30. The other end surface of the cylindrical block 30 is provided with tapped openings 34 for mounting. This cylindrical block 30 with the radiating fins 32 will provide substantially all the heat removal that the semiconductor wafer 10 will require under normal operating conditions.

A cylindrical surface 36 of a material consisting of a lower portion 38 and upper portion 40, such as steel, is provided with the lower edge of the lower portion 38 brazed to the copper block 30 and an outturned flange 42 provided on the upper edge thereof. The upper cylindrical portion 40 has an outturned flange 44 provided on the lower edge and such that the flanges 42 and 44 of the two members 38 and 40 meet and may be heliarc welded in the final step prior to evacuation of the enclosure. The upper cylindrical member 40 is provided with an inturned flange 46 about its upper periphery through which leads 48 and 50 to the base and collector electrodes 16 and 14 respectively pass. The flexible terminal conductors 48 and 50 provided for the collector and the base may be of a braided copper material of suitable size to carry the desired current. The flexible conductors 48 and 50 are secured to their respective connectors on the electrodes in any suitable manner such as soldering. The two flexible members 48 and 50 pass through the upper closure member 52 of material such as Kovar of the cylindrical member 40 and are vacuum sealed therein. This seal may be provided by use of a solid copper sleeve 61 brazed to each of the flexible members 48 and 50 and to the Kovar sleeve 54 with an intervening glass sleeve 56 to the Kovar closure member 52. The Kovar member 52 is sealed to the cylinder 40. An exhaust tubulation 58 of metal may be provided in a similar manner in the upper closure member 52 of the structure.

The structure is then evacuated and an inert gas, such as argon or nitrogen, may be inserted into the gas-tight cavity to help insure against moisture contamination of the semiconductor device. The large surface area of the plate structure of the collector and base electrodes also provide a large surface area which may be utilized, if desired, by the insertion of a cooling medium such as hydrocarbon compound. It is possible thereby to further enhance cooling of wafer 10 by condensation and evaporation on the surfaces of the plate in a well known manner.

Figure 4:
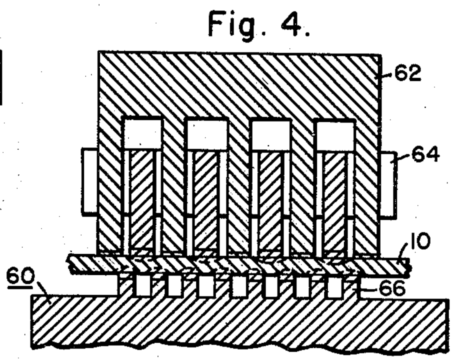
Fig. 4 is a sectional view of a semiconductor device embodying a modification of our invention.

Referring in detail to Fig. 4, there is shown a structure in which two plate type electrodes 62 and 64 similar to 14 and 16 are positioned on the upper surface of the wafer 10. The electrode 62 serves as the base electrode and the electrode 64 as the emitter electrode. An electrode 60 is provided on the lower surface of the wafer 10 and in this case serves as the collector electrode. The collector electrode 60 in this embodiment on the lower surface rather than being a planar-type structure is also in the form of a plurality of plates 66. The edges of the plates 66 in contact with the wafer 10 are positioned so as to be diametrically opposite the intervening space between the emitter and base plate contacts on the opposite side of the semiconductor device. By positioning the collector plates or projecting ribs 66 between the emitter and base electrodes, it is possible to reduce the collector area and, therefore, to reduce the inverse leakage current. Although this structure reduces the total area, it is found that pockets of gas form during processing. These pockets of gas cannot escape on a large area contact. By the rib structure, only small distances are involved and permit escape of gas resulting in more uniform wetting.

Figure 5:
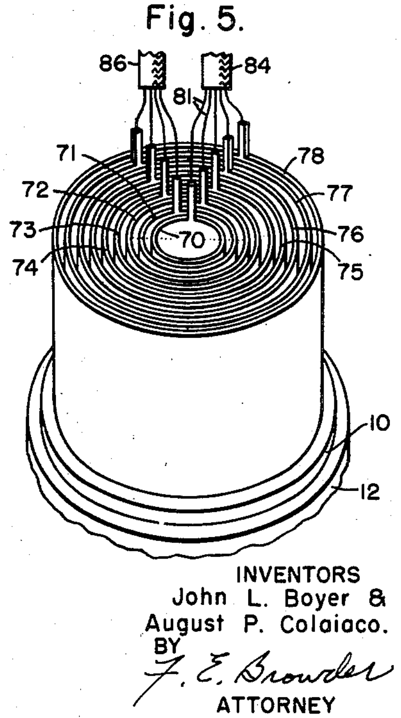
Fig. 5 is a perspective view of a semiconductor device embodying another modification of our invention.

Referring in detail to Fig. 5, there is shown a structure in which rather than use the parallel planar structure, as shown in Figs. 1, 2, 3 and 4, concentric tubular members 70 to 78 are used to form the top electrodes, and the tubes 70, 72, 74, 76 and 78 are connected together as a base electrode and the tubes 71, 73, 75 and 77 are connected together as the collector electrode in an alternate manner. This design has the advantage in that the cylindrical tubes 70–78 are self-supporting and may be placed on top of the semiconductor wafer 10 in the manufacturing process. Connections to the individual tubings 70–78 may be made by having different heights of the tubes or on different angles. In the specific example shown, multiple strands 81 on collector and base leads 84 and 86 provide means of connecting the cylindrical members 70 to 78 together in desired arrangement as shown in Fig. 5. With the exception of the different configuration of the electrodes, the construction and materials are similar to those described with respect to Figs. 1–3. The electrode 12 serves as the emitter electrode.

While we have shown our invention in only a few forms, it will be obvious to those skilled in the art that it is not so limited, but is susceptible to various other changes and modifications without departing from the spirit and scope thereof.

We claim as our invention:

1. A translation device comprising a body of semiconductor material of one type conductivity having two parallel large dimension surfaces, said body having a plurality of spaced zones of opposite type conductivity material positioned in one surface thereof, electrode contacts to said zones and said body to provide two electrodes, said electrodes consisting of a plurality of spaced large area sheet-like members having a coefficient of thermal expansion similar to said semiconductor material positioned with an edge of each of said members positioned on the surface in which said zones are positioned, a first group of said members forming one electrode in contact with said zones in the surface of said body and a second group of said members forming the other electrode in contact with said body intermediate said zones to form two interleaved structures.

2. A translation device comprising a body of semiconductor material of one type conductivity having two parallel large dimension surfaces, said body having a plurality of spaced zones on one surface and a surface region zone on the other surface of opposite type conductivity material than said body, electrode contacts to said zones and said body to provide three terminals, two of said electrodes consisting of a plurality of large area plates having good thermal and electrical conductivity and having a coefficient of thermal expansion substantially the same as said semiconductor material positioned edgewise on to said spaced zone surface, and in contact with said zones in the surface of said body, means connecting said plates to two terminals in an alternate relation and the other electrode in contact with said surface region zone on the other surface of said body.

3. A translation device comprising a body of semiconductor material of one type conductivity having two parallel large dimension surfaces, said body having a plurality of spaced inclusion zones of opposite type conductivity material than said body within one surface thereof, the other surface of said body having a continuous surface region zone of similar type conductivity material as said inclusion zones, electrode contacts to said zones and said body to provide three terminals, two of said electrodes consisting of a plurality of juxtapositioned large area sheet-like members having good thermal and electrical conductivity and having a coefficient of thermal expansion similar to said semiconductor material positioned with an edge on the surface of said body in which said inclusion zones are provided and in contact with said zones and the intermediate region of said body between said zones, means connecting said members in contact with said inclusion zones to one terminal and those members in contact with the said body to another terminal to provide an alternate relation contact to said body and inclusion zones across the upper surface of said semiconductor body, and the other electrode contact with said surface region zone on the opposite surface of said body.

4. A semiconductor device comprising a relatively fragile flat body of semiconductive material of one type conductivity, a plurality of inclusion zones in one surface of said body of a different conductivity type than said body, a plurality of parallel plates having good thermal conductivity and having a coefficient of thermal expansion similar to that of said semiconductor material, said plates positioned on the inclusion zone surface of said body so as to be perpendicular to the surface of said body and with each plate having one edge in good thermal and electrical contact with each of said inclusion zones, means for connecting said plates in an alternate relation to two separate multiple type contact electrodes and an electrode positioned on the opposite surface of said body with respect to said inclusion zone surface to provide a multiple contact area such that the contact area is diametrically opposite the intervening area between said plates positioned on the inclusion zone surface.

5. A semiconductor device comprising a relatively flat fragile body of semiconductor material of one type conductivity, a plurality of parallel plates having good thermal and electrical conductivity and having a coefficient of thermal expansion similar to that of said semiconductor material, said plates positioned on one surface of said body and perpendicular to the surface thereof, the contact edges of said plates fused to said body, means for connecting said plates in two groups in an alternate relation to provide two separate electrodes, at least one of said groups of plates fused to said body with a material to convert the region of said body adjacent said plate edge to an opposite conductivity type material and an electrode fused to the other surface of said body to convert said body adjacent said electrode to an opposite type conductivity material.

6. A semiconductor device comprising a relatively flat fragile body of semiconductor material of one type conductivity, a plurality of parallel surfaces having good thermal and electrical conductivity and having a coefficient of thermal expansion similar to that of said semiconductor material, said surfaces positioned on one surface of said body and perpendicular to the surface thereof, the contact edges of said surfaces fused to said body, means for connecting said surfaces in two groups in an alternate relation to provide two separate electrodes, at least one of said groups of surfaces fused to said body with a material to convert the region of said body adjacent said surface edge to an opposite conductivity type material and an electrode fused to the other surface of said body to convert said body adjacent said electrode to an opposite type conductivity material.

7. A translation device comprising a flat body of semiconductor material of one type conductivity having two substantially parallel large dimension surfaces, said body having a plurality of spaced inclusion zones of opposite type conductivity material than said body positioned in one surface thereof, electrode contacts to said zones and said body to provide two electrodes, said electrodes consisting of a plurality of tubular spaced members having a coefficient of thermal expansion similar to said semiconductor material and positioned substantially perpendicular to the surface in which said zones are positioned, a first group of said tubular members forming one electrode in contact with said zones in the surface of said body and a second group of said tubular members forming the other electrode in contact with said body intermediate said zones to form two interleaved structures.

References Cited in the file of this patent

UNITED STATES PATENTS

| | | |
|---|---|---|
| 2,689,930 | Hall | Sept. 21, 1954 |
| 2,721,965 | Hall | Oct. 25, 1955 |
| 2,730,663 | Harty | Jan. 10, 1956 |